United States Patent
Sakthivel et al.

(10) Patent No.: US 12,151,263 B2
(45) Date of Patent: Nov. 26, 2024

(54) PIEZOELECTRIC CERAMIC CRYSTALS INTEGRATING AN IMPEDANCE MATCHING REGION AND A BACKING REGION, METHODS OF DESIGNING PIEZOELECTRIC CERAMIC CRYSTALS, AND METHODS OF FORMING PIEZOELECTRIC CERAMIC CRYSTALS

(71) Applicant: Baker Hughes Oilfield Operations LLC, Houston, TX (US)

(72) Inventors: Navin Sakthivel, Spring, TX (US); Aaron Avagliano, Tomball, TX (US)

(73) Assignee: Baker Hughes Oilfield Operations LLC, Houston, TX (US)

( * ) Notice: Subject to any disclaimer, the term of this patent is extended or adjusted under 35 U.S.C. 154(b) by 491 days.

(21) Appl. No.: 17/459,980

(22) Filed: Aug. 27, 2021

(65) Prior Publication Data
US 2023/0065276 A1    Mar. 2, 2023

(51) Int. Cl.
| | |
|---|---|
| *B06B 1/06* | (2006.01) |
| *B28B 1/00* | (2006.01) |
| *B29C 64/165* | (2017.01) |
| *B29C 64/386* | (2017.01) |
| *B33Y 10/00* | (2015.01) |
| *B33Y 50/00* | (2015.01) |
| *G05B 19/4099* | (2006.01) |
| *G06F 30/20* | (2020.01) |

(Continued)

(52) U.S. Cl.
CPC ............. *B06B 1/067* (2013.01); *B28B 1/001* (2013.01); *B29C 64/165* (2017.08); *B29C 64/386* (2017.08); *B33Y 10/00* (2014.12); *B33Y 50/00* (2014.12); *G05B 19/4099* (2013.01); *G06F 30/20* (2020.01); *G06N 20/20* (2019.01); *B29K 2063/00* (2013.01); *B29K 2509/02* (2013.01); *B29K 2995/0003* (2013.01); *B29L 2031/3406* (2013.01); *G05B 2219/49023* (2013.01); *Y10T 29/42* (2015.01)

(58) Field of Classification Search
CPC ....... B06B 1/067; B06B 1/0644; Y10T 29/42; Y10T 29/49005; H03H 3/08
USPC ........................ 29/25.35, 593, 594, 844, 846
See application file for complete search history.

(56) References Cited

U.S. PATENT DOCUMENTS

| | | | |
|---|---|---|---|
| 5,636,147 A * | 6/1997 | Tolmie ................. | B06B 1/0207 703/5 |
| 2006/0150380 A1* | 7/2006 | Ossmann ............... | B06B 1/067 29/25.35 |

OTHER PUBLICATIONS

Rubio et al., Modeling of Functionally Graded Piezoelectric Ultrasonic Transducers, Ultrasonics, vol. 49, (2009), pp. 484-494.

* cited by examiner

*Primary Examiner* — Thiem D Phan
(74) *Attorney, Agent, or Firm* — TraskBritt

(57) ABSTRACT

A method of designing and forming a piezoelectric ceramic crystal integrating an impedance matching region and a backing region. The method includes receiving one or more required operating parameters of the piezoelectric ceramic crystal for an application, iteratively modeling and simulating performance of one or more materials, structures, and gradients to utilize within the piezoelectric ceramic crystal, identifying at least one material, structure, or gradient that exhibits predicted performance that at least substantially achieves the one or more required operating parameters of the piezoelectric ceramic crystal, outputting a design of the piezoelectric ceramic crystal, and forming the piezoelectric ceramic crystal via one or more additive manufacturing processes.

20 Claims, 10 Drawing Sheets

(51) Int. Cl.
  *G06N 20/20* (2019.01)
  *B29K 63/00* (2006.01)
  *B29K 509/02* (2006.01)
  *B29L 31/34* (2006.01)

PIEZOELECTRIC CERAMIC CRYSTALS INTEGRATING AN IMPEDANCE MATCHING REGION AND A BACKING REGION, METHODS OF DESIGNING PIEZOELECTRIC CERAMIC CRYSTALS, AND METHODS OF FORMING PIEZOELECTRIC CERAMIC CRYSTALS

TECHNICAL FIELD

This disclosure relates generally to acoustic transducers having piezoelectric ceramic crystals. This disclosure further relates to methods of designing and forming piezoelectric ceramic crystals. This disclosure also relates to methods of forming piezoelectric ceramic crystals via additive manufacturing processes.

BACKGROUND

Piezo-electric ceramics (e.g., piezoelectric transducers) are utilized in a wide variety of applications. For example, piezo-electric ceramics are conventionally used in force microscopy, nano-positioning, micromechanical systems (MEMS), nanoelectromechanical systems (NEMS), energy harvesters, microphones, headphones, loudspeakers, acoustic emission sensors, vibration sensors, fluid characteristic sensors, inertial sensors, tactile sensors, power harvesting, ultrasound transducers, and guided wave sensors. Recently, use of piezo-electric ceramics in various applications has surged due to their ability to produce real-time high resolution 3D images of a target load (e.g., fluid, biological tissue, etc.).

Efficiency of performance of piezo-electric ceramics depends on the proper matching of acoustic impedances, especially when considered during design stages. Furthermore, proper matching is limited by conventional design and manufacturing processes.

BRIEF SUMMARY

One or more embodiments of the present disclosure include a method of designing a piezoelectric ceramic crystal integrating an impedance matching region and a backing region, the method comprising: receiving one or more desired operating parameters of one or more of the piezoelectric ceramic crystal, the impedance matching region of the piezoelectric ceramic crystal, or the backing region of the piezoelectric ceramic crystal for an application; iteratively modeling and simulating performance of one or more materials and one or more gradients of the one or more materials to utilize within one or more of the piezoelectric ceramic crystal, the impedance matching region of the piezoelectric ceramic crystal, or the backing region of the piezoelectric ceramic crystal; iteratively modeling and simulating performance of one or more structures and one or more gradients of the one or more structures to utilize within one or more of the piezoelectric ceramic crystal, the impedance matching region of the piezoelectric ceramic crystal, or the backing region of the piezoelectric ceramic crystal; and identifying at least one material, at least one gradient of the at least one material, at least one structure, and at least one gradient of the at least one structure that exhibits a predicted performance that at least substantially achieves the one or more desired operating parameters of one or more of the piezoelectric ceramic crystal, the impedance matching region of the piezoelectric ceramic crystal, or the backing region of the piezoelectric ceramic crystal for the application.

Additional embodiments of the present disclosure include a method of forming a piezoelectric ceramic crystal integrating an impedance matching region and a backing region, the method comprising: receiving a three-dimensional model design of the piezoelectric ceramic crystal integrating the impedance matching region and the backing region; forming the piezoelectric ceramic crystal via one or more additive manufacturing processes; and forming at least one of the impedance matching region or the backing region of the piezoelectric ceramic crystal to comprise at least one attribute that is graded along an axis of the piezoelectric ceramic crystal.

Some embodiments of the present disclosure include a method of forming a piezoelectric ceramic crystal integrating an impedance matching region and a backing region, the method comprising: receiving one or more desired operating parameters of one or more of the piezoelectric ceramic crystal, the impedance matching region of the piezoelectric ceramic crystal, or the backing region of the piezoelectric ceramic crystal for an application; iteratively modeling and simulating performance of at least one of one or more gradients of one or more materials or one or more gradients of one or more structures to utilize within one or more of the piezoelectric ceramic crystal, the impedance matching region of the piezoelectric ceramic crystal, or the backing region of the piezoelectric ceramic crystal; identifying at least one of a gradient of a material or a gradient of a structure that exhibits a predicted performance that at least substantially achieves the one or more desired operating parameters of one or more of the piezoelectric ceramic crystal, the impedance matching region of the piezoelectric ceramic crystal, or the backing region of the piezoelectric ceramic crystal for the application; outputting a design of the piezoelectric ceramic crystal integrating the impedance matching region and the backing region based at least partially on at least one of the identified gradient of the material or the identified gradient of the structure; and forming the piezoelectric ceramic crystal integrating the impedance matching region and the backing region via one or more additive manufacturing processes.

BRIEF DESCRIPTION OF THE DRAWINGS

For a detailed understanding of the present disclosure, reference should be made to the following detailed description, taken in conjunction with the accompanying drawings, in which like elements have generally been designated with like numerals, and wherein:

FIG. 9 shows a flowchart of a method of designing a piezoelectric ceramic crystal according to one or more embodiments of the present disclosure.

DETAILED DESCRIPTION

Figure 1A:
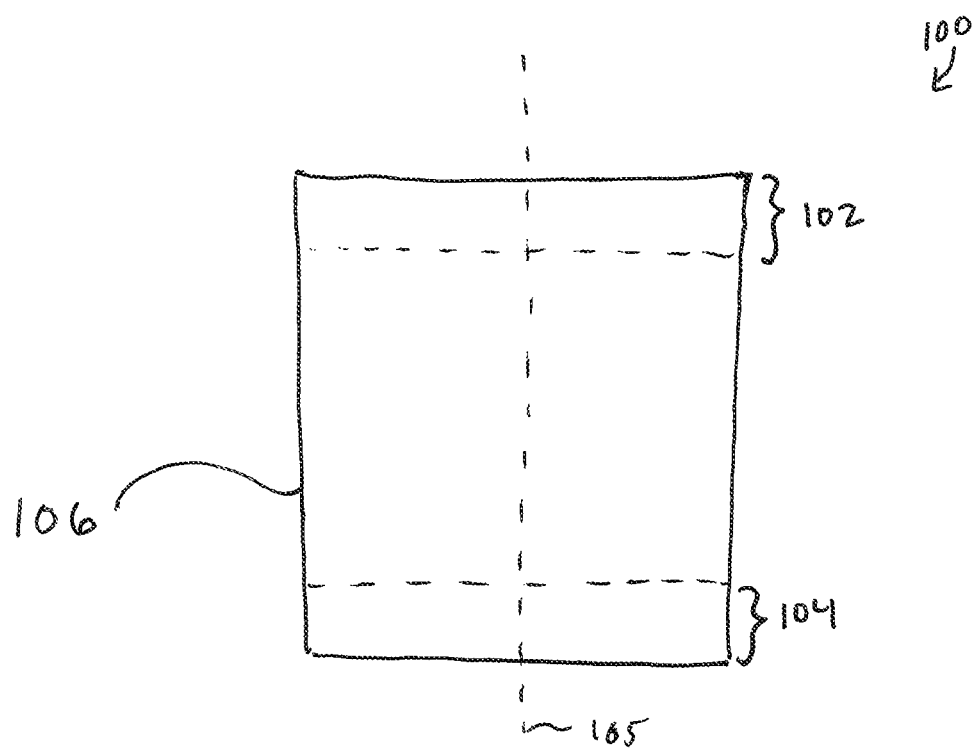
FIG. 1A is a schematic cross-sectional side view of a piezoelectric ceramic crystal integrating an impedance matching region and a backing region according to one or more embodiments of the present disclosure.

The illustrations presented herein are not actual views of any particular piezoelectric ceramic crystal, piezo-electric ceramic, additive manufacturing system, or any component of such, but are merely idealized representations, which are employed to describe the present invention.

As used herein, any relational term, such as "first," "second," "front," "back," etc., is used for clarity and convenience in understanding the disclosure and accompanying drawings, and does not connote or depend on any specific preference or order, except where the context clearly indicates otherwise.

As used herein, the terms "comprising," "including," "containing," "characterized by," and grammatical equivalents thereof are inclusive or open-ended terms that do not exclude additional, un-recited elements or method steps, but also include the more restrictive terms "consisting of," "consisting essentially of," and grammatical equivalents thereof.

As used herein, the term "may" with respect to a material, structure, feature, or method act indicates that such is contemplated for use in implementation of an embodiment of the disclosure, and such term is used in preference to the more restrictive term "is" so as to avoid any implication that other compatible materials, structures, features, and methods usable in combination therewith should or must be excluded.

As used herein, the term "configured" refers to a size, shape, material composition, and arrangement of one or more of at least one structure and at least one apparatus facilitating operation of one or more of the structure and the apparatus in a predetermined way.

As used herein, the singular forms following "a," "an," and "the" are intended to include the plural forms as well, unless the context clearly indicates otherwise.

As used herein, the term "and/or" includes any and all combinations of one or more of the associated listed items.

As used herein, the term "substantially" in reference to a given parameter, property, or condition means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, or even at least about 99% met.

As used herein, the term "about" used in reference to a given parameter is inclusive of the stated value and has the meaning dictated by the context (e.g., it includes the degree of error associated with measurement of the given parameter).

Some embodiments of the present disclosure include methods of designing and forming piezoelectric ceramic crystals integrating an impedance matching region and a backing region. In particular, embodiments of the present disclosure include methods for designing and forming functionally graded piezoelectric ceramic crystals having properties (e.g., the piezo-electric constant, the dielectric constant, and the electromechanical coupling factor) of the piezoelectric ceramic crystal functionally graded in a desired direction. Furthermore, the design of the piezoelectric ceramic crystal eliminates separate and distinct impedance matching layers and a backing layer while improving performance of an associated acoustic transducer and providing the flexibility to tailor the design according to a case-by-case basis.

FIG. 1A shows an acoustic transducer 100 according to one or more embodiments of the disclosure. In some embodiments, the acoustic transducer 100 may include an additive manufactured acoustic transducer. For example, one or more elements of the acoustic transducer 100 may be formed via an additive manufacturing process. Furthermore, the acoustic transducer 100 may include a functionally-graded piezoelectric ceramic crystal 106 (referred to hereinafter as "piezoelectric ceramic crystal 106"). Moreover, the piezoelectric ceramic crystal 106 may include an integrated impedance matching region 102 and an integrated backing region 104. For example, the piezoelectric ceramic crystal 106 may include a single unitary body that includes the impedance matching region 102 and the backing region 104.

As is discussed in greater detail below, the piezoelectric ceramic crystal 106 may include one or more attributes (e.g., density, lattice structure (e.g., crystal lattice), material and/or chemical composition, elastic modulus, porosity, residual stress, or electric poling) that are graded (e.g., functionally graded) along an axis 105 (e.g., longitudinal axis or thickest direction) of the piezoelectric ceramic crystal 106, and the graded attributes may cause and enable the impedance matching region 102 and the backing region 104 of the piezoelectric ceramic crystal 106 to mimic operation of typical matching layers and backing layers, respectively. Moreover, by grading the one or more attributes along an axis 105 of the piezoelectric ceramic crystal 106, properties, such as, the piezo-electric constant, the dielectric constant, and the electromechanical coupling factor of the piezoelectric ceramic crystal 106 can be functionally graded along the axis 105 or in another desired direction.

In some embodiments, the backing region 104 of the piezoelectric ceramic crystal 106 may be formed or defined on a first side of the piezoelectric ceramic crystal 106 (e.g., a rear side of the piezoelectric ceramic crystal 106), and the impedance matching region 102 may be formed or defined on a second, opposite side of the piezoelectric ceramic crystal 106 (e.g., a front side of the piezoelectric ceramic crystal 106 or a portion of the piezoelectric ceramic crystal 106 intended to interface with a target medium). In operation, the piezoelectric ceramic crystal 106 may vibrate (i.e., generate an acoustic wave) in response to an applied voltage or may generate a voltage in response to an applied vibration (e.g., an acoustic wave (e.g., an ultrasonic wave)). The backing region 104 may prevent the piezoelectric ceramic crystal 106 from excessively vibrating. By reducing excessive vibration, the backing region 104 may cause the piezoelectric ceramic crystal 106 to generate acoustic waves with a shorter pulse length, which may improve resolution of ultimate output data (e.g., received acoustic waves that are converted to voltages) of the acoustic transducer 100. Additionally, when the backing region 104 has a high absorption, the backing region 104 may prevent spurious reflection from a back of the acoustic transducer. As a non-limiting example, an acoustic impedance of ≥6.0 MRayl may be used to optimize operation parameters (e.g., pulse-echo parameters) of the acoustic transducer 100.

The impedance matching region 102 of the piezoelectric ceramic crystal 106 may enable acoustic waves to efficiently enter a medium (e.g., a fluid) being measured and/or sensed. For example, an impedance of the impedance matching region 102 may substantially match an impedance of the medium being tested and may at least substantially prevent the acoustic waves from reflecting off the medium being tested. Put another way, the impedance matching region 102 may reduce reflection of the acoustic waves emitted by the piezoelectric ceramic crystal 106 by the medium being tested.

Referring still to FIG. 1A, as a non-limiting example, an impedance matching region 102 of the piezoelectric ceramic crystal 106 with acoustic impedance ($Z_{Mn}$) may be used to transform an impedance of the piezoelectric ceramic crystal ($Z_A$) to more closely match a medium ($Z_B$) through which the acoustic waves may be propagated (e.g., a front propagating media). The energy transmission through the impedance matching region 102 is maximized when the acoustic impedance of the impedance matching region 102 is the geometric mean of the impedance of the piezoelectric ceramic crystal ($Z_A$) and the impedance of the medium ($Z_B$), as represented in the following:

$$Z_M = \sqrt{Z_A Z_B}$$

Additionally, designs of the impedance matching region 102 of the piezoelectric ceramic crystal 106 may optimize pulse-echo performance parameters of the acoustic transducer 100.

Embodiments of the present disclosure include an acoustic transducer 100 having each portion of the piezoelectric ceramic crystal 106 (e.g., the impedance matching region 102 and the backing region 104) thereof being formed via additive manufacturing (e.g., 3D printing). As is described in greater detail below, forming the piezoelectric ceramic crystal 106 of the acoustic transducer 100 to integrate the impedance matching region 102 and the backing region 104 instead of having separate impedance matching layers and a separate backing layer, and forming the piezoelectric ceramic crystal 106 of the acoustic transducer 100 via additive manufacturing may improve impedance matching, enable selectable (e.g., engineered) bandwidths, enable selectable (e.g., engineered) sensitivity and resolution, improve energy transmission and reduce losses, control damping effects, reduce manufacturing steps, reduce design and manufacturing time and costs, enable efficient production of case-by-case acoustic transducers, etc.

As a non-limiting example, the piezoelectric ceramic crystal 106 and any other element of the acoustic transducer 100 can be formed via any suitable additive manufacturing processes known in the art. As a non-limiting example, in one or more embodiments, the acoustic transducer 100 and/or any element thereof may be formed via one or more additive manufacturing processes, such as, for example, binder jetting, stereolithography (SLA), sol-gel or liquid dispense methods, inkjet 3D printing, direct metal deposition, micro-plasma powder deposition, direct laser sintering, selective laser sintering, electron beam melting, electron beam freeform fabrication, fused deposition modeling, and other additive manufacturing processes. In some embodiments, an entirety of the piezoelectric ceramic crystal 106 of the acoustic transducer 100 may be formed via a same additive manufacturing process. In other embodiments, one or more regions (e.g., the impedance matching region 102, the backing region 104, and/or a remainder region) of the piezoelectric ceramic crystal 106 of the acoustic transducer 100 may be formed via differing additive manufacturing processes. Furthermore, as is described in further detail below, in some embodiments, an entirety of the piezoelectric ceramic crystal 106 of the acoustic transducer 100 may be formed via a single additive manufacturing process and a single additive manufacturing system. In other embodiments, one or more regions of the piezoelectric ceramic crystal 106 of the acoustic transducer 100 may be formed via a first additive manufacturing process and a first additive manufacturing system, and one or more regions of the piezoelectric ceramic crystal 106 of the acoustic transducer 100 may be formed via a second additive manufacturing process and a second additive manufacturing system. For example, the second additive manufacturing process may include printing directly on a portion of the piezoelectric ceramic crystal 106 formed via the first additive manufacturing process.

Figure 1B:
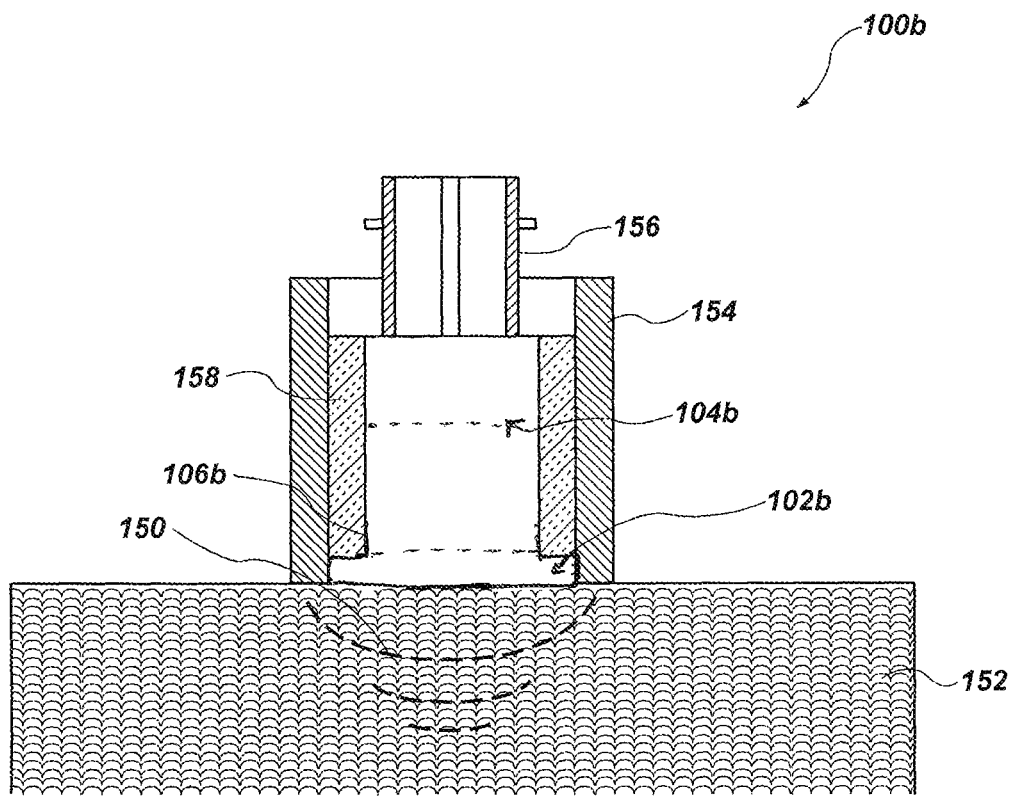
FIG. 1B is a schematic cross-sectional side view of another piezoelectric ceramic crystal integrating an impedance matching region and a backing region according to one or more embodiments of the present disclosure.

FIG. 1B shows an acoustic transducer 100b according to one or more embodiments of the disclosure. Similar to the acoustic transducer 100 described above in regard to FIG. 1A, the acoustic transducer 100b may include an additive manufactured acoustic transducer. In one or more embodiments, the acoustic transducer 100b may include a piezoelectric ceramic crystal 106b having an integrated impedance matching region 102b and an integrated backing region 104b, The acoustic transducer 100b may further include an insulation material 158, a casing 154, and a connector 156.

In some embodiments, the backing region 104b of the piezoelectric ceramic crystal 106b may be formed or defined on a first side of the piezoelectric ceramic crystal 106b, and the impedance matching region 102b of the piezoelectric ceramic crystal 106b may be formed or defined on a second, opposite side of the piezoelectric ceramic crystal 106b. The insulation material 158 may at least partially surround the backing region 104b and the piezoelectric ceramic crystal 106b and may be disposed between the piezoelectric ceramic crystal 106b and the casing 154. The connector 156 may be coupled to the backing region 104b of the piezoelectric ceramic crystal 106b on a side opposite the impedance matching region 102b.

In operation, the piezoelectric ceramic crystal 106b may vibrate and generate an acoustic wave 150 in response to an applied voltage or may generate a voltage in response to an applied vibration (e.g., an acoustic wave (e.g., an ultrasonic wave)). As discussed herein, the acoustic transducer 100b may be utilized to emit the acoustic wave 150 into a medium 152 (e.g., a wave propagating media).

Referring to FIGS. 1A and 1B together, in some embodiments, the acoustic transducers 100, 100b may not include impedance matching layers or backing layers that are separate and distinct from the piezoelectric ceramic crystal 106, 106b. Rather, as discussed above, the piezoelectric ceramic crystal 106, 106b may include integrated regions (e.g., portions) having internal and/or external structures and/or materials that result in the regions mimicking operation of typical impedance matching layers and backing layers. Furthermore, as mentioned above, the impedance matching region 102 and the backing region 104 may be formed and defined by grading (e.g., gradients of) one or more attributes (e.g., density, lattice structure (e.g., crystal lattice), material and/or chemical composition, elastic modulus, porosity, residual stress, or electric poling) of the piezoelectric ceramic crystal 106, 106b along one or more axes 105 (e.g., a longitudinal axis) of the piezoelectric ceramic crystal 106, 106b. Moreover, by grading the one or more attributes along an axis 105 of the piezoelectric ceramic crystal 106, 106b, properties, such as, the piezo-electric constant, the dielectric constant, and the electromechanical coupling factor of the piezoelectric ceramic crystal 106, 106b can be functionally graded along the axis 105 or in another desired direction according to one or more gradients (e.g., functions). Additionally, properties, such as, a speed of sound through the piezoelectric ceramic crystal 106, 106b can be functionally graded along the axis 105 or in another desired direction according to one or more gradients. Likewise, the one or more attributes and/or properties may be engineered (e.g., selectable) within and along the gradients.

FIGS. 2-6 show graphs 200, 300, 400, 500, 600 depicting example gradients for attribute values of a piezoelectric ceramic crystal 106, 106b (FIG. 1A, 1B) along an axis of the piezoelectric ceramic crystal 106, 106b (FIG. 1A, 1B). The piezoelectric ceramic crystals 106, 106b are referred to collectively as the "piezoelectric ceramic crystal 106" hereinafter for clarity. For the purposes of FIGS. 1A-6, the attributes of the piezoelectric ceramic crystal 106 may include a density, a material percentage by volume or weight, a chemical percentage by volume or weight, an elastic modulus, a porosity, a residual stress, an electric poling, or a rate of lattice structure (e.g., crystal lattice) of the piezoelectric ceramic crystal 106. Furthermore, as is discussed in greater detail below, in some embodiments, the gradients may be at least partially determined via modeling and simulation of a piezoelectric ceramic crystal design.

Figure 2:
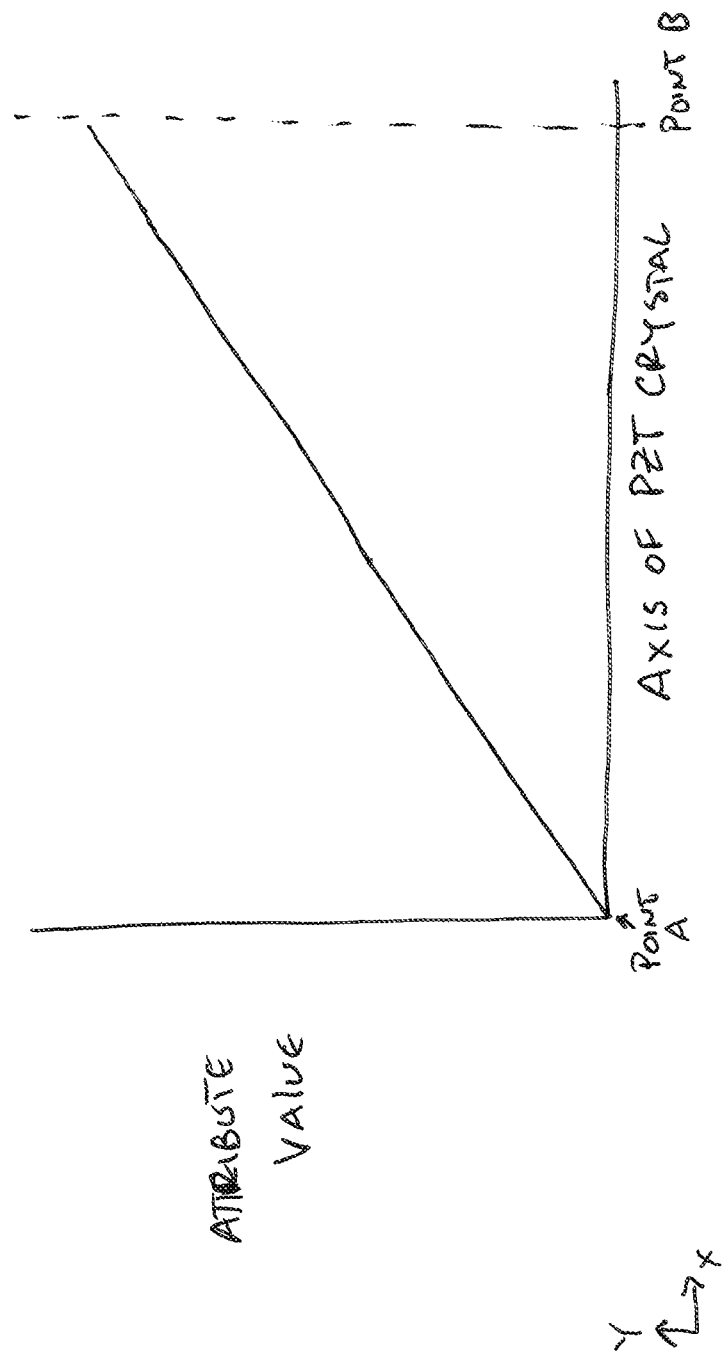
FIG. 2 shows a graph depicting a gradient according to which an attribute of a piezoelectric ceramic crystal may be graded according to one or more embodiments of the present disclosure.

As shown in FIG. 2, in some embodiments, a gradient 202 of one or more attribute values of a piezoelectric ceramic crystal may reflect a linear gradient along an axis of the piezoelectric ceramic crystal. In other words, the one or more attribute values of a piezoelectric ceramic crystal represented by the gradient 202 may increase or decrease at a linear rate or maintain a value along the axis of the piezoelectric ceramic crystal. For purposes of FIG. 2, the X-axis may represent an entire length of the axis of the piezoelectric ceramic crystal, or the X-axis may represent only a region or portion of the length of the axis of the piezoelectric ceramic crystal. For instance, in some embodiments, the X-axis may represent only an impedance matching region or other region of the piezoelectric ceramic crystal along the axis of the piezoelectric ceramic crystal, and the gradient 202 may be exhibited in that region (e.g., only in that region).

Figure 3:
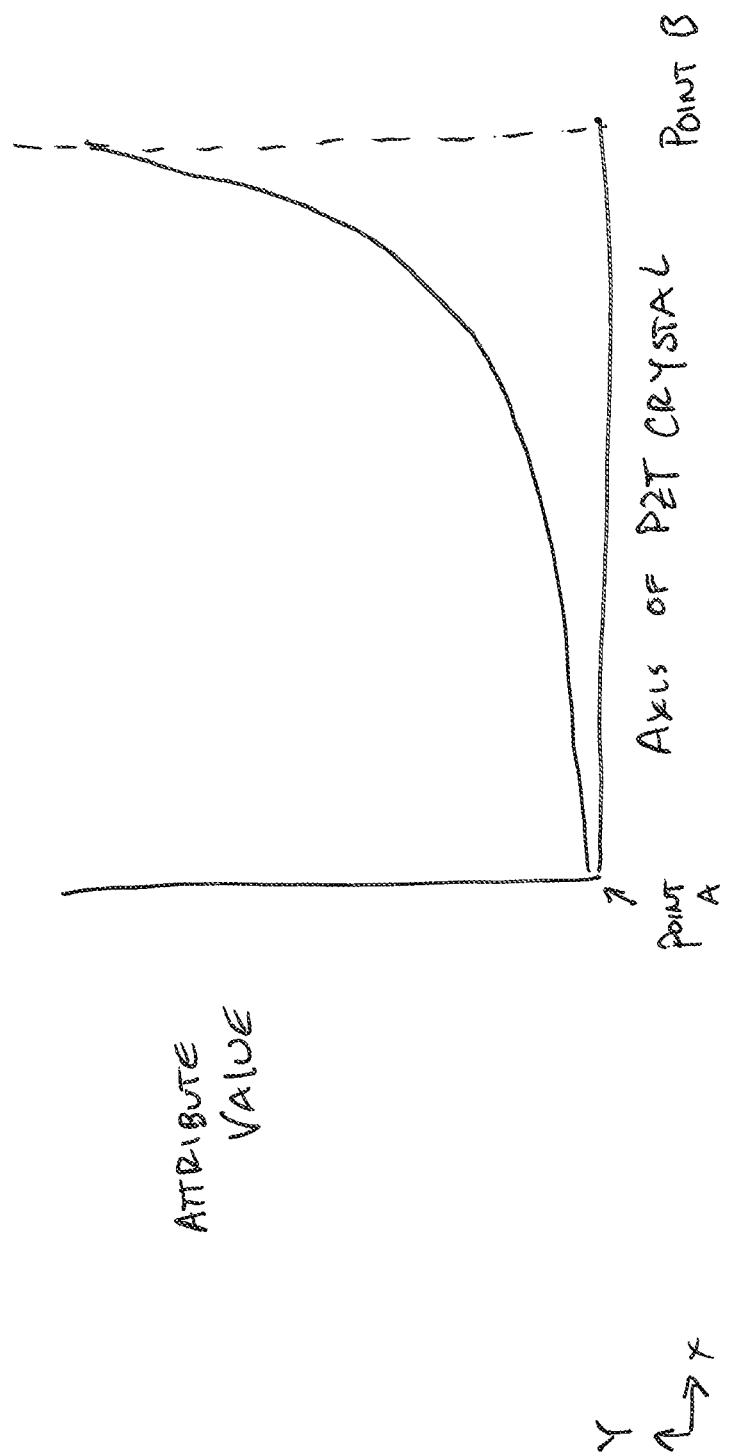
FIG. 3 shows a graph depicting a gradient according to which an attribute of a piezoelectric ceramic crystal may be graded according to one or more embodiments of the present disclosure.

As shown in FIG. 3, in one or more embodiments, a gradient 302 of one or more attribute values of a piezoelectric ceramic crystal may reflect an exponential gradient along an axis of the piezoelectric ceramic crystal. In other words, the one or more attribute values of a piezoelectric ceramic crystal represented by the gradient 302 may increase or decrease at an exponential rate along the axis of the piezoelectric ceramic crystal. For purposes of FIG. 3, the X-axis may represent an entire length of the axis of the piezoelectric ceramic crystal, or the X-axis may represent only a region or portion of the length of the axis of the piezoelectric ceramic crystal. For instance, in some embodiments, the X-axis may represent only an impedance matching region or other region of the piezoelectric ceramic crystal along the axis of the piezoelectric ceramic crystal, and the gradient 302 may be exhibited in that region (e.g., only in that region).

Figure 4:
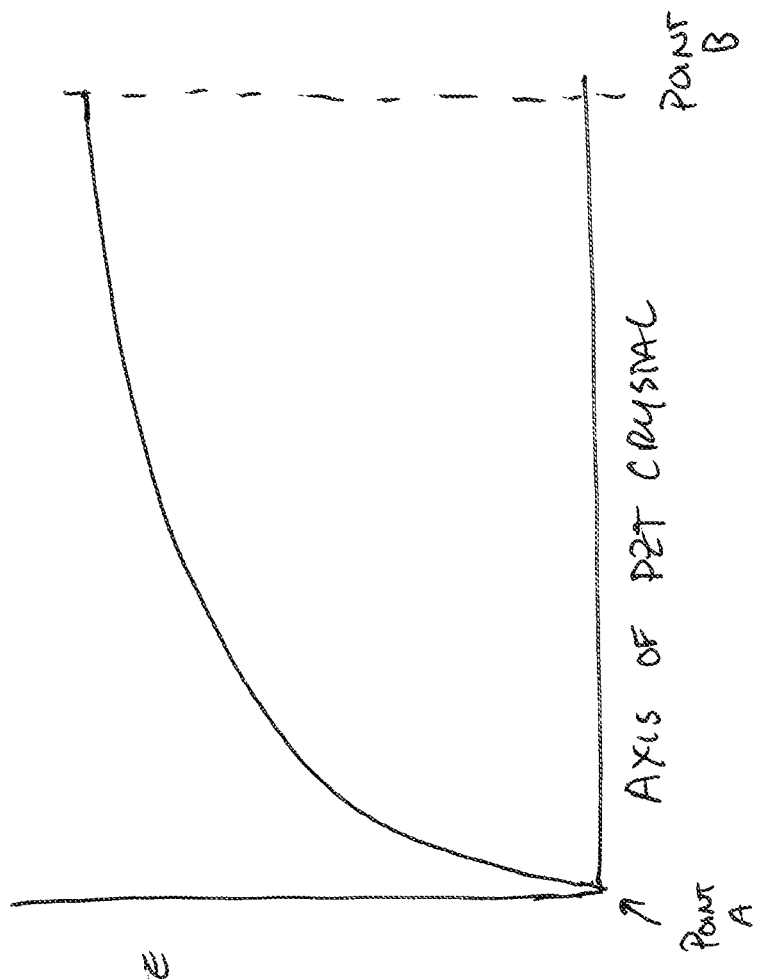
FIG. 4 shows a graph depicting a gradient according to which an attribute of a piezoelectric ceramic crystal may be graded according to one or more embodiments of the present disclosure.

As shown in FIG. 4, in one or more embodiments, a gradient 402 of one or more attribute values of a piezoelectric ceramic crystal may reflect a logarithmic gradient along an axis of the piezoelectric ceramic crystal. In other words, the one or more attribute values of a piezoelectric ceramic crystal represented by the gradient 402 may increase or decrease at logarithmic rate along the axis of the piezoelectric ceramic crystal. For purposes of FIG. 4, the X-axis may represent an entire length of the axis of the piezoelectric ceramic crystal, or the X-axis may represent only a region or portion of the length of the axis of the piezoelectric ceramic crystal. For instance, in some embodiments, the X-axis may represent only an impedance matching region or other region of the piezoelectric ceramic crystal along the axis of the piezoelectric ceramic crystal, and the gradient 402 may be exhibited in that region (e.g., only in that region).

Figure 5:
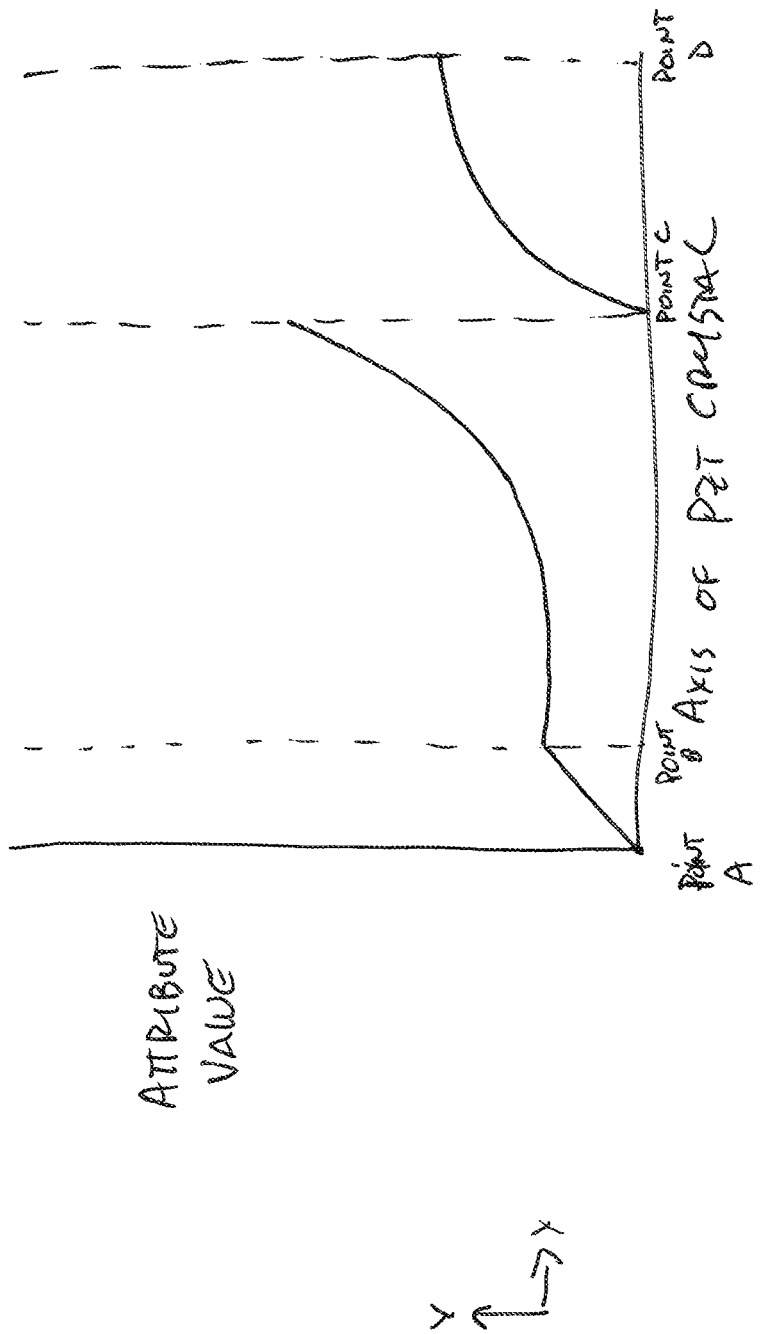
FIG. 5 shows a graph depicting a gradient according to which an attribute of a piezoelectric ceramic crystal may be graded according to one or more embodiments of the present disclosure.

As shown in FIG. 5, in one or more embodiments, gradients 502a, 502b, 502c of one or more attribute values of a piezoelectric ceramic crystal may reflect differing gradients along an axis of the piezoelectric ceramic crystal. In other words, the one or more attribute values of a piezoelectric ceramic crystal represented by the gradients 502a, 502b, 502c may increase or decrease at differing rates along the axis of the piezoelectric ceramic crystal. For purposes of FIG. 5, the X-axis may represent an entire length of the axis of the piezoelectric ceramic crystal, or the X-axis may represent only a region or portion of the length of the a xis of the piezoelectric ceramic crystal. For instance, in some embodiments, the X-axis may represent only an impedance matching region or other region of the piezoelectric ceramic crystal along the axis of the piezoelectric ceramic crystal, and the gradients 502a, 502b, 502c may be exhibited in that region (e.g., only in that region).

Referring still to FIG. 5, in some embodiments, within a given region or length of the axis of the piezoelectric ceramic crystal, various gradients may be represented for a given attribute. For example, a first portion of a given region (e.g., impedance matching region) of the piezoelectric ceramic crystal may exhibit a first gradient (e.g., linear gradient), a second portion of the given region of the piezoelectric ceramic crystal may exhibit a second, different gradient (e.g., an exponential gradient), and a third portion of the given region of the piezoelectric ceramic crystal may exhibit a third, different gradient (e.g., a logarithmic gradient). Furthermore, as depicted in FIG. 5, in some embodiments, at a transition from a first portion of the region (e.g., the first gradient) to a second portion of the region (e.g., the second gradient), the attribute values within the first and second portions of the region may be connected. In other words, the attribute value at an end of the first portion along the axis of the piezoelectric ceramic crystal may be the same as the attribute value at the beginning of the second portion of the region along the axis of the piezoelectric ceramic crystal. In additional embodiments, at a transition from a first portion of the region (e.g., the second gradient) to a second portion of the region (e.g., the third gradient), the attribute values within the first and second portions of the region may be disconnected. In other words, the attribute value at an end of the first portion along the axis of the piezoelectric ceramic crystal may be the different than the attribute value at the beginning of the second portion of the region along the axis of the piezoelectric ceramic crystal.

Figure 6:
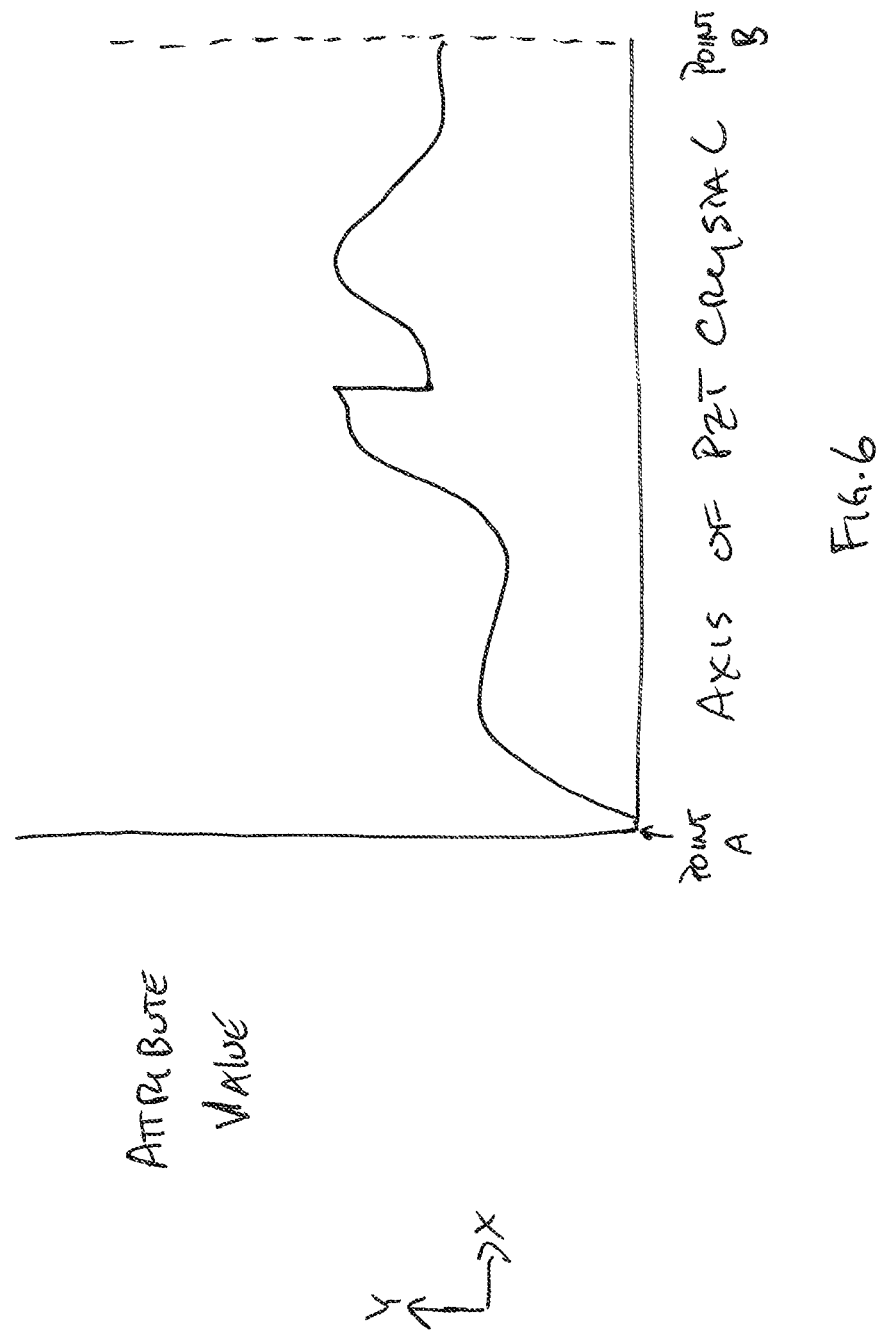
FIG. 6 shows a graph depicting a gradient according to which an attribute of a piezoelectric ceramic crystal may be graded according to one or more embodiments of the present disclosure.

As shown in FIG. 6, in one or more embodiments, a gradient 602 of one or more attribute values of a piezoelectric ceramic crystal may reflect an irregular gradient along an axis of the piezoelectric ceramic crystal. In other words, the one or more attribute values of a piezoelectric ceramic crystal represented by the gradient 602 may increase or decrease at irregular rates along the axis of the piezoelectric ceramic crystal. For purposes of FIG. 6, the X-axis may represent an entire length of the axis of the piezoelectric ceramic crystal, or the X-axis may represent only a region or portion of the length of the axis of the piezoelectric ceramic crystal. For instance, in some embodiments, the X-axis may represent only an impedance matching region or other region of the piezoelectric ceramic crystal along the axis of the piezoelectric ceramic crystal, and the gradient 602 may be exhibited in that region (e.g., only in that region).

Referring to FIGS. 1A-6 together, various attributes of the piezoelectric ceramic crystal 106 may have differing gradients along a same or different axis of the piezoelectric ceramic crystal 106. For example, a first attribute (e.g., density) of the piezoelectric ceramic crystal 106 may exhibit a first gradient (e.g., linear gradient) along an axis of the piezoelectric ceramic crystal 106, and a second attribute (e.g., a material percentage (e.g., material composition)) of the piezoelectric ceramic crystal 106 may exhibit a second, different gradient (e.g., exponential gradient) along the same axis of the piezoelectric ceramic crystal 106. As another non-limiting example, a first attribute of the piezoelectric ceramic crystal 106 may exhibit a first gradient along a first axis of the piezoelectric ceramic crystal 106, and a second attribute of the piezoelectric ceramic crystal 106 may exhibit a second, different gradient along a second, different axis of the piezoelectric ceramic crystal 106. As yet another non-limiting example, a first attribute of the piezoelectric ceramic crystal 106 may exhibit a gradient along an axis of the piezoelectric ceramic crystal 106, and a second attribute of the piezoelectric ceramic crystal 106 may exhibit a same gradient along a same or different axis of the piezoelectric ceramic crystal 106.

Referring still to FIGS. 1A-6, in some embodiments, an impedance matching region 102 of the piezoelectric ceramic crystal 106 of the acoustic transducer 100 may exhibit a first gradient for a given attribute, and the backing region 104 of the piezoelectric ceramic crystal 106 of the acoustic transducer 100 may exhibit a second, different gradient for the same given attribute. In additional embodiments, the impedance matching region 102 and the backing region 104 may exhibit a same gradient for a given attribute. Furthermore, a remainder of the piezoelectric ceramic crystal 106 (e.g., a region not include within the impedance matching region 102 and the backing region 104) may exhibit a same or different gradient for a given attribute than the gradient(s) exhibited for the given attribute within the impedance matching region 102 and the backing region 104. Additionally, in some embodiments, one or more regions of the piezoelectric ceramic crystal 106 may simply not include an attribute included within one or more other regions of the piezoelectric ceramic crystal 106.

Figure 7:
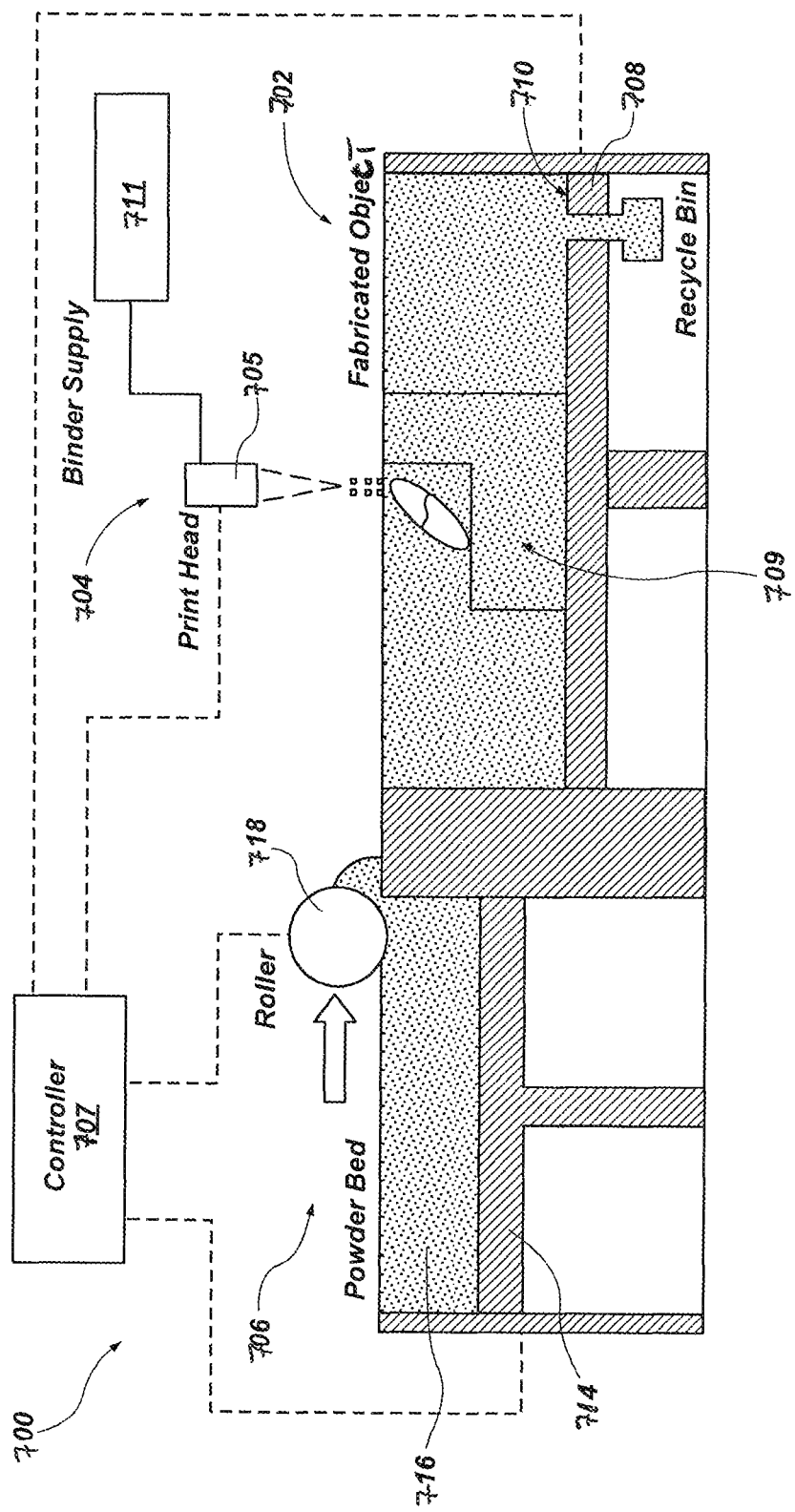
FIG. 7 is a schematic view of an additive manufacturing system according to one or more embodiments of the present disclosure.

For clarity and by way of example and not limitation, a description of an example additive manufacturing method by which the piezoelectric ceramic crystal 106 may be formed is provided below with reference to FIG. 7. FIG. 7 is a schematic view of an additive manufacturing system 700 according to one or more embodiments of the present disclosure. In some embodiments, the additive manufacturing system 700 includes a build assembly 702, a binder deposition system 704, a source material assembly 706, and a controller 707. Each of the build assembly 702, the binder deposition system 704, and the source material assembly 706 may be operably coupled to the controller 707. The build assembly 702 may include a build platform 708, a build plate 710 disposed on an upper surface of the build platform 708 and for supporting a part 709 (e.g., body) to be constructed, and one or more fasteners removably securing the build plate 710 to the build platform 708.

In some embodiments, the build platform 708 may include a piston, which translates in a vertical direction (e.g., a vertical Z axis) during part 709 formation. Furthermore, the build platform 708 may incrementally lower in a vertical direction during a part 709 printing process. For instance, the build platform 708 may include any conventional build platform known in the art.

The source material assembly 706 may include a material delivery platform 714, a source material 716, and a material applicator 718. In some embodiments, the material delivery platform 714 may include a piston, which translates in the vertical direction (e.g., the vertical Z axis), and the source material 716 may be disposed upon the piston. For instance, the material delivery platform 714 may translate upward in the vertical direction during a part printing process, and the material applicator 718 (e.g., a powder roller, a powder blade) may move source material 716 from on top of the material delivery platform 714 to the build assembly 702. For example, the material applicator 718 (e.g., a roller, a blade) may skim powder source material 716 from on top of the top of the material delivery platform 714 and may spread a layer over the build platform 708. For instance, the source material assembly 706 may include any conventional source material assembly 706 known in the art.

The binder deposition system 704 may include a printing head 705 and a binder supply 711. The printing head 705 deposits (e.g., jets) a binding agent onto the powder according to a part's geometry (e.g., the piezoelectric ceramic crystal 106, 106b (FIGS. 1A, 1B)). The binder deposition system 704 may direct the printing head 705 in the X and Y directions via conventional methods. For example, the binder deposition system 704 may include any conventional binder deposition system 704 known in the art. Subsequently, another layer of the source material 716 may be spread over the binding agent and the previous layer, and the process of spreading layers and depositing binding agent according to the part's geometry may be repeated to form layers of the part and, ultimately, form the part (e.g., one or more elements of the acoustic transducer 100) itself.

The controller 707 may include a processor, a memory, a storage device, an I/O interface, and a communication interface, which may be communicatively coupled by way of a communication infrastructure. In one or more embodiments, the processor includes hardware for executing instructions, such as those making up a computer program. The memory may be used for storing data, metadata, and programs for execution by the processor(s). The storage device includes storage for storing data or instructions. The I/O interface allows a user to provide input to, receive output from, and otherwise transfer data to and receive data from the additive manufacturing system 700. The communication interface can include hardware, software, or both. In any event, the communication interface can provide one or more interfaces for communication (such as, for example, packet-based communication) between the additive manufacturing system 700 and one or more other computing devices or networks.

In operation, the controller 707 may slice a three-dimensional model into layers via a conventional process to create a two-dimensional image of each layer. Subsequently, the material applicator 718 may spread a thin layer of source material 716 (e.g., 0.1 mm thick layer of material) over the build plate 710 and the build platform 708. The binder deposition system 704 may deposit a binding agent on the layer of source material 716 to fuse or bond a first layer of material according to the two-dimensional image of the first layer. The build platform 708 then incrementally lowers (e.g., lowers by the same amount as the thickness of the layer of source material 716), and the process repeats until the entire (or at least a portion) of the three-dimensional model is created. For instance, the additive manufacturing system 700 may operate in a conventional manner.

Referring to FIGS. 1A-7 together, the additive manufacturing system 700 may include one or more additive manufacturing systems in addition to or instead of a binder jetting system. For instance, the additive manufacturing system 700 may include additive manufacturing systems for performing one or more of stereolithography (SLA), sol-gel or liquid dispense methods, inkjet 3D printing, direct metal deposition, micro-plasma powder deposition, direct laser sintering, selective laser sintering, electron beam melting, electron beam freeform fabrication, fused deposition modeling, or other additive manufacturing processes. In some embodiments, parameters of the additive manufacturing process may be tuned and selected to induce localized stresses in the part to tune and select attributes within the part (e.g., piezoelectric ceramic crystal 106).

Figure 8:
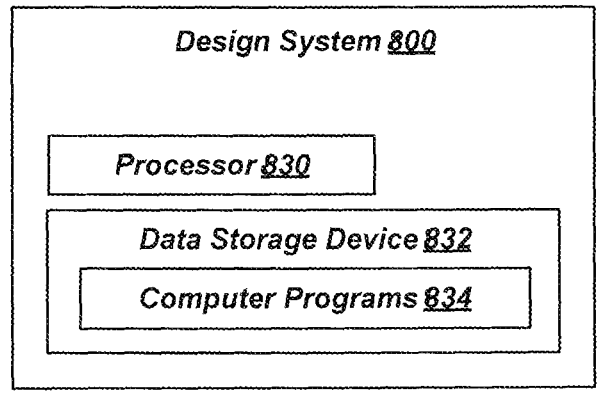
FIG. 8 shows a schematic view of a design system for designing piezoelectric ceramic crystals according to one or more embodiments of the present disclosure.
Figure 4:
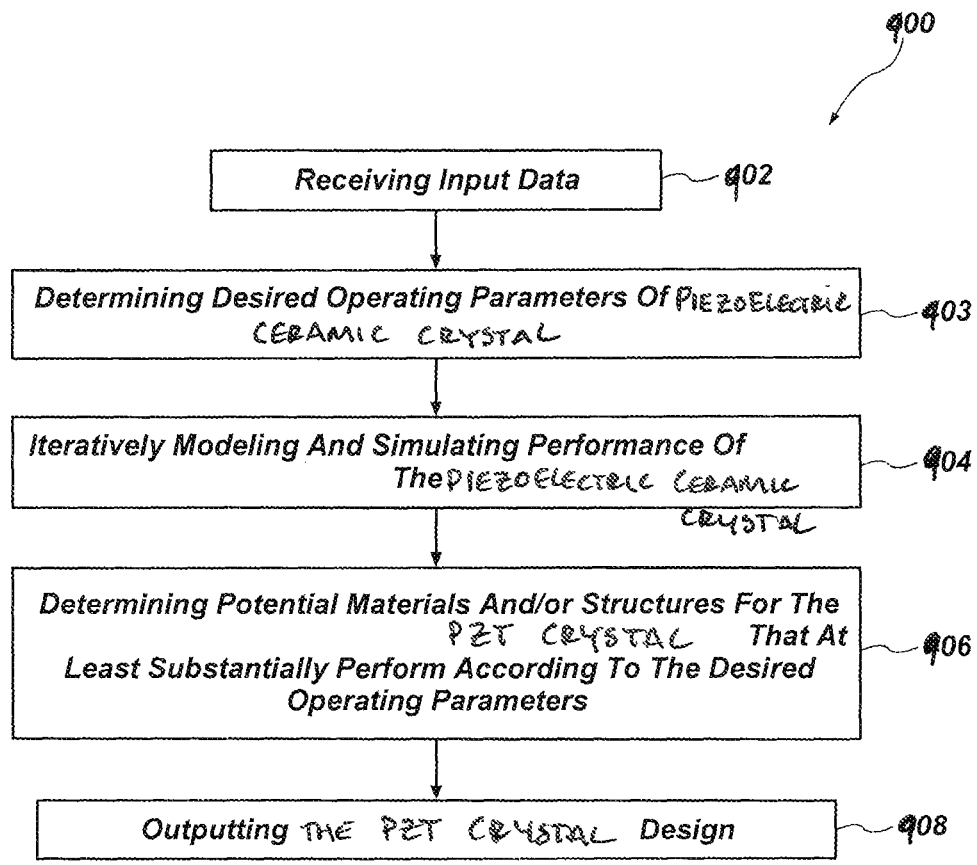

FIG. 8 shows a schematic view of a design system 800. The design system 800 may include a processor 830 and a data storage device 832 (or a computer-readable medium) for storing data, algorithms, and computer programs 834. The data storage device 832 may be any suitable device, including, but not limited to, a read-only memory (ROM), a random-access memory (RAM), a flash memory, a magnetic tape, a hard disk, and an optical disk. Additionally, the design system 800 may further include one or more devices for presenting output to an operator of the design system 800, including, but not limited to, a graphics engine, a display (e.g., a display screen), one or more output drivers (e.g., display drivers), one or more audio speakers, and one or more audio drivers. In certain embodiments, the design system 800 is configured to provide graphical data to a display for presentation to the operator. The graphical data may be representative of one or more graphical user interfaces and/or any other graphical content as may serve a particular implementation. As is described in greater detail in regard to FIGS. 9 and 10, the design system 800 may generate predictive models of piezoelectric ceramic crystals 106 having impedance matching and backing regions and having functionally graded attributes (e.g., density, lattice structure (e.g., crystal lattice), material and/or chemical composition, elastic modulus, porosity, residual stress, or electric poling) utilizing one or more machine learning techniques. Furthermore, based on the generated predictive models, the design system 800 may select gradients and attributes for the piezoelectric ceramic crystals 106 to optimize performance (e.g., critical to quality ("CTQ") parameters) of the piezoelectric ceramic crystals 106 for a given application.

FIG. 9 shows a flowchart of a method 900 of designing a piezoelectric ceramic crystal 106 having integrated impedance matching 102 and backing regions 104. In some embodiments, the method 900 may include receiving input data, as shown in act 902 of FIG. 9. For example, the design system (e.g., design system 800) may receive the input data. In some embodiments, the input data may include historical data, sensor data, and/or application data (e.g., data regarding a given application within which a piezoelectric ceramic crystal 106 is intended to be used). As used herein, the term "application" may refer to an environment (e.g., temperatures, pressures, environmental conditions, etc.) and a medium to be tested (e.g., a fluid) within which the piezoelectric ceramic crystal 106 is intended to be used. In some embodiments, the historical data may include data regarding previously implemented piezoelectric ceramic crystals and performance data regarding those piezoelectric ceramic crystals and associated application data. The sensor data may include data from sensors disposed within environments within which the piezoelectric ceramic crystal 106 is intended to be used. The application data may include environmental data (e.g., data regarding environmental conditions and size limitations) and medium data (e.g., data regarding the medium to be tested).

In some embodiments, the method 900 may further include determining desired (e.g., ideal) operating parameters (e.g., pulse-echo parameters) and desired properties (e.g., the piezo-electric constant, the dielectric constant, and the electromechanical coupling factor) of a piezoelectric ceramic crystal 106 for a given application (e.g., the intended application of the piezoelectric ceramic crystal), as shown in act 903 of FIG. 9. For example, the design system 800 may determine optimized operating parameters for the piezoelectric ceramic crystal 106 and the impedance matching 102 and backing regions 104 of the piezoelectric ceramic crystal 106 based on the given application. Put another way, the design system 800 may define CTQs for the piezoelectric ceramic crystal 106 and the given application. For example, the design system 800 may define required frequencies of the piezoelectric ceramic crystals, desired footprint (e.g., size) of the piezoelectric ceramic crystals 106, signal strength requirements, bandwidth requirements, etc. As non-limiting examples, in regard to the piezoelectric ceramic crystal in general and the given application, the design system 800 may determine required or preferred operating parameters, such as optimized excitation levels, attenuation of back reflection, bandwidth, phase linearity, sensitivity, pulse-length, and pulse width for the given application. As another non-limiting example, in regard to the impedance matching region 102 of the piezoelectric ceramic crystal 106 and the given application, the design system 800 may determine required or preferred (e.g., optimized) impedance of the impedance matching region 102 of the piezoelectric ceramic crystal 106 for the given application. As yet another non-limiting example, in regard to the backing region 104 and the given application, the design system 800 may determine required or preferred (e.g., optimized) attenuation or dampening levels of the backing region 104.

In some embodiments, the design system 800 may not determine the required or preferred operating parameters and/or properties of the piezoelectric ceramic crystal 106 or regions of the piezoelectric ceramic crystal 106; rather, in such embodiments, the required or preferred operating parameters and/or properties of the piezoelectric ceramic crystal 106 or regions of the piezoelectric ceramic crystal 106 may be input into the design system 800. In other words, the required or preferred operating parameters and/or properties of the piezoelectric ceramic crystal 106 or regions of the piezoelectric ceramic crystal 106 for the given application may be included within the received input data. For instance, the design system 800 may receive required or preferred operating parameters and/or properties of the piezoelectric ceramic crystal 106 or regions of the piezoelectric ceramic crystal 106 from an external source.

Responsive to receiving and/or determining the required or preferred operating parameters and/or properties of the piezoelectric ceramic crystal 106 and/or regions of the piezoelectric ceramic crystal 106, the method 900 includes iteratively modeling and simulating performance (e.g., generating predictive performance models) of potential materials, structures (e.g., geometries), and gradients (e.g., graded attributes as described herein) of the piezoelectric ceramic crystal 106 and/or regions of the piezoelectric ceramic crystal 106 within the given application, as shown in act 904. As used herein, the term "performance" may refer to modeled and/or simulated operating parameters of the piezoelectric ceramic crystal 106 and/or regions of the piezoelectric ceramic crystal 106, such as the operating parameters described herein. For example, the method 900 includes iteratively modeling and simulating performance of the potential materials, structures, and gradients (e.g., graded attributes as described herein) of the piezoelectric ceramic crystal 106 and/or regions of the piezoelectric ceramic crystal 106 when applied to the given application. For instance, the method 900 may include varying one or more of aspects (e.g., attributes, attribute gradients, and/or an internal and/or external structure) of the piezoelectric ceramic crystal 106 and/or regions of the piezoelectric ceramic crystal 106 and then modeling and simulating performance of the piezoelectric ceramic crystal 106 and/or regions of the piezoelectric ceramic crystal 106. As a non-limiting example, modeling and simulating performance of the potential materials, structures, and gradients (e.g., graded attributes as described herein) of the piezoelectric ceramic crystal 106 and/or regions of the piezoelectric ceramic crystal 106 when applied to the given application may incrementally adjust one or more aspects (e.g., attributes, attribute gradients, and/or an internal and/or external structure) of the piezoelectric ceramic crystal 106 and/or regions of the piezoelectric ceramic crystal 106 and model and simulate performance of each increment.

In some embodiments, the method 900 may include generating predictive models to tune material properties of the piezoelectric ceramic crystal 106 and/or regions of the piezoelectric ceramic crystal 106 for the given application. Additionally, the method 900 may include generating predictive models to tune the structure (e.g., geometry) of the piezoelectric ceramic crystal 106 and/or regions of the piezoelectric ceramic crystal 106 for the given application. Also, the method 900 may include generating predictive models to tune the attribute gradients of the piezoelectric ceramic crystal 106 and/or regions of the piezoelectric ceramic crystal 106 for the given application. Furthermore, the method 900 may include generating predictive models combining the tuned material properties, tuned structure (e.g., geometry), and tuned attribute gradients of the piezoelectric ceramic crystal 106 and/or regions of the piezoelectric ceramic crystal 106 for the given application. Moreover, as is described in further detail below, modeling and simulating performance of the potential materials, structures, structures, and gradients (e.g., graded attributes as described herein) of the piezoelectric ceramic crystal 106 and/or regions of the piezoelectric ceramic crystal 106 when applied to the given application may include optimizing a design of an acoustic transducer 100 based on the predictive models described herein and to at least substantially meet the desired (e.g., ideal) operating parameters (e.g., CTQs) of the piezoelectric ceramic crystal 106.

In one or more embodiments, iteratively modeling and simulating potential materials may include iteratively modeling various different materials, various different material and chemical compositions, various material and chemical gradients, and material and chemical densities throughout the piezoelectric ceramic crystal 106 and/or regions of the piezoelectric ceramic crystal 106. Furthermore, iteratively modeling and simulating potential materials may include iteratively modeling various combinations of lead zirconium titanate (PZT) and polymer binders.

In one or more embodiments, iteratively modeling and simulating potential structures may include iteratively modeling various internal and external structures of the piezoelectric ceramic crystal 106 and/or regions of the piezoelectric ceramic crystal 106 For example, iteratively modeling and simulating potential structures may include modeling various internal and/or external lattice structures (e.g., honey comb structures, electric eel bionic structures, coral reef structures, etc.) and gradients of internal and/or external lattice structures of the piezoelectric ceramic crystal 106 and/or regions of the piezoelectric ceramic crystal 106. Additionally, iteratively modeling and simulating potential structures may include modeling acoustic structures such as a conch structure, a trumpet horn structure, an ear drum cochlea shape, an elephant trunk shape, a golden ratio shape, etc. Moreover, iteratively modeling and simulating potential structures may include modeling various porosities and/or gradients of porosities within the piezoelectric ceramic crystal 106 and/or regions of the piezoelectric ceramic crystal 106. Furthermore, iteratively modeling and simulating potential structures may include modeling various densities and density gradients throughout the piezoelectric ceramic crystal 106 and/or regions of the piezoelectric ceramic crystal 106. Likewise, iteratively modeling and simulating potential structures may include modeling various elastic moduli, elastic moduli gradients, residual stresses, residual stress gradients, electric poling, and/or electric poling gradients throughout the piezoelectric ceramic crystal 106 and/or regions of the piezoelectric ceramic crystal 106.

In some embodiments, iteratively modeling and simulating potential materials, structures, and gradients of the piezoelectric ceramic crystal 106 and/or regions of the piezoelectric ceramic crystal 106 may include utilizing one or more machine learning techniques and/or deep learning techniques to iteratively model and simulate performance of potential materials, structures, and gradients of the piezoelectric ceramic crystal 106 and/or regions of the piezoelectric ceramic crystal 106. For example, the design system 800 may utilize one or more machine learning techniques to iteratively model and simulate performance of the potential materials, structures, and gradients of the piezoelectric ceramic crystal 106 and/or regions of the piezoelectric ceramic crystal 106. In some embodiments, the machine learning and/or deep learning techniques may include one or more of regression models (e.g., a set of statistical processes for estimating the relationships among variables), classification models, and/or phenomena models. Additionally, the machine-learning techniques and/or deep learning techniques may include a quadratic regression analysis, a logistic regression analysis, a support vector machine, a Gaussian process regression, ensemble models, or any other regression analysis. Furthermore, in yet further embodiments, the machine-learning techniques and/or deep learning techniques may include decision tree learning, regression trees, boosted trees, gradient boosted tree, multilayer perceptron, one-vs-rest, Naïve Bayes, k-nearest neighbor, association rule learning, a neural network, deep learning, pattern recognition, or any other type of machine-learning.

In some embodiments, the design system 800 may utilize historical data, feedback data, and/or known physics models, acoustics models, and/or mechanics models to train the machine-learning models to match material compositions, external structures, internal structures, and/or gradients with performance (e.g., operating parameters) of the piezoelectric ceramic crystal 106 and/or regions of the piezoelectric ceramic crystal 106. In other words, via the machine learning model techniques, the design system 800 may learn correlations between input data (e.g., material compositions, external structures, internal structures, and/or gradients of the piezoelectric ceramic crystal 106 and/or regions of the piezoelectric ceramic crystal 106, data regarding the given application, etc.) and performance (e.g., operating parameters of the piezoelectric ceramic crystal 106 and/or regions of the piezoelectric ceramic crystal 106). Put another way, the design system 800 may learn the relationship between the input data and the performance of the modeled/simulated piezoelectric ceramic crystal 106 and/or regions of the piezoelectric ceramic crystal 106. For example, as will be understood in the art, for a given set of input values (e.g., given application and materials, structure, and gradients of the piezoelectric ceramic crystal 106 and/or regions of the piezoelectric ceramic crystal 106), the design system 800 is expected to produce the consistent and accurate output values (i.e., performance data). In particular, the machine learning models may be trained via supervised learning, as is known in the art. After a sufficient number of iterations, the machine learning models become trained machine-learning models. In some embodiments, the machine learning models may also be trained on historical data from previously designed and implemented acoustic transducers.

Referring still to act 904 of FIG. 9, in some embodiments, one or more of the piezoelectric ceramic crystal 106, backing region 104 of the piezoelectric ceramic crystal 106, or the impedance matching region 102 of the piezoelectric ceramic crystal 106, and the medium 152 to be measured may be modeled using a one-dimensional transmission line model.

Additionally, one or more of the piezoelectric ceramic crystal 106, backing region 104 of the piezoelectric ceramic crystal 106, or the impedance matching region 102 of the piezoelectric ceramic crystal 106, and the medium 152 to be measured may be modeled in one or more two-dimensional models and/or three-dimensional models.

The method 900 may further include determining (e.g., identifying) materials, structures, and/or gradients that at least substantially perform according to the desired (e.g., ideal) operating parameters for the given application (e.g., achieve or meet the CTQs), as shown in act 906 of FIG. 9. For example, based at least partially on iteratively modeled and simulated performances of the materials, structures, and/or gradients of the piezoelectric ceramic crystal 106 and/or regions of the piezoelectric ceramic crystal 106, the design system 800 may identify materials, structures, and/or gradients that result in performance (e.g., performance of the piezoelectric ceramic crystal 106 and/or regions of the piezoelectric ceramic crystal 106) and properties (e.g., piezo-electric constant, dielectric constant, and electromechanical coupling factor) of the piezoelectric ceramic crystal 106 within the given application that at least substantially matches the desired operating parameters and properties described above in regard to act 902 of FIG. 9.

As a non-limiting example, in regard to the piezoelectric ceramic crystal 106, the design system 800 may identify materials, structures, and/or gradients that at least substantially yield the optimized excitation levels, attenuation of back reflection, bandwidth, and pulse width for the given application. For example, in regard to the piezoelectric ceramic crystal 106, the design system 800 may identify materials, structures, and/or gradients that yield desired elastic moduli, porosities, chemical compositions, crystal lattices, residual stresses, and/or electric polings, which determine the piezo-electric properties (e.g., piezo-electric constant, dielectric constant, and electromechanical coupling factor) of the piezoelectric ceramic crystal 106. As another non-limiting example, in regard to the impedance matching region 102 of the piezoelectric ceramic crystal 106, the design system 800 may identify materials, structures, and/or gradients that at least substantially yield the optimized impedance of the impedance matching region 102 for the given application (e.g., match impedance between a target load and the piezoelectric ceramic crystal 106). Furthermore, in regard to the impedance matching region 102, the design system 800 may identify materials, structures, and/or gradients that at least substantially optimize transmission of pressure waves. As yet another non-limiting example, in regard to the backing region 104 of the piezoelectric ceramic crystal 106, the design system 800 may identify materials, structures, and/or gradients that at least substantially yield the optimized attenuation or dampening levels of the backing region 104.

In some embodiments, determining (e.g., identifying) materials, structures, and/or gradients that at least substantially perform according to the desired (e.g., ideal) operating parameters for the given application may include identifying materials, structures, and/or gradients at best approach the desired (e.g., ideal) operating parameters. For example, in some instances, the exact desired (e.g., ideal) operating parameters may not be achievable via simulated materials, structures, and/or gradients, and in such case, a best option may be identified.

Responsive to identifying materials, structures, and/or gradients that at least substantially perform according to the desired (e.g., ideal) operating parameters for the given application, the method 900 may include outputting a piezoelectric ceramic crystal design, as shown in act 908 as shown in FIG. 9. For example, the design system 800 may output (e.g., generate) a data package indicating a material composition and/or structure of the piezoelectric ceramic crystal including at least one of the impedance matching region 102 or the backing region of the piezoelectric ceramic crystal 106. In some embodiments, the piezoelectric ceramic crystal design may include a three-dimensional model of the piezoelectric ceramic crystal 106 that can be sliced into layers and utilized by one or more additive manufacturing systems. For instance, as is be described in further detail below, in some embodiments, the piezoelectric ceramic crystal design may be output (e.g., transmitted) to one or more additive manufacturing systems (e.g., additive manufacturing system 700) for fabrication.

Figure 10:
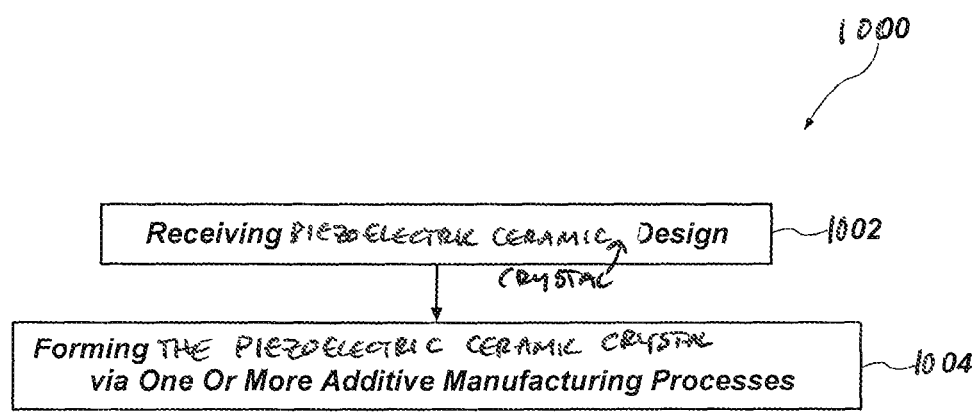
FIG. 10 shows a flowchart of a method of forming a piezoelectric ceramic crystal according to one or more embodiments of the disclosure.

FIG. 10 shows a flowchart of a method 1000 of forming a piezoelectric ceramic crystal 106 according to one or more embodiments of the disclosure. In some embodiments, the method 1000 may include forming piezoelectric ceramic crystal 106 via one or more additive manufacturing processes. In one or more embodiments, the method 900 may include receiving a piezoelectric ceramic crystal design, as shown in act 1002 of FIG. 10. For example, an additive manufacturing system may receive the piezoelectric ceramic crystal design from the design system 800.

Responsive to receiving the acoustic transducer design, the method 1000 may include forming the piezoelectric ceramic crystal 106 via one or more additive manufacturing processes, as shown in act 1004 of FIG. 10. For example, one or more additive manufacturing systems (e.g., additive manufacturing system 700) may form the piezoelectric ceramic crystal 106 via one or more of binder jetting, SLA, sol-gel of liquid dispensing, inkjet 3D printing, direct metal deposition, micro-plasma powder deposition, direct laser sintering, selective laser sintering, electron beam melting, fused deposition modeling, or electron beam freeform fabrication.

In one or more embodiments, the method 1000 may include an entirety of the piezoelectric ceramic crystal 106 via a single additive manufacturing process. For example, an entirety of the piezoelectric ceramic crystal 106 may be printed simultaneously, substantially simultaneously, or consecutively during a single additive manufacturing process. In other embodiments, the method 1000 may include forming the piezoelectric ceramic crystal 106 via multiple additive manufacturing processes. For example, at least a portion of the piezoelectric ceramic crystal 106 may be formed during a first additive manufacturing process and at least one second portion of the piezoelectric ceramic crystal 106 may be formed during a second additive manufacturing process. For example, the portions from via second additive manufacturing process may be formed directly on the portion formed during the first additive manufacturing process.

Referring still to FIG. 10, in some embodiments, the method 1000 may include forming one or more regions of the piezoelectric ceramic crystal 106 with a combination of lead Zirconium Titanate (PZT) and a polymer binder. In some embodiments, the polymer binder may include an ultra-violet curing polymer or resin (e.g., epoxy terminated silicon, iodonium salt, photosensitizer, and silica). In additional embodiments, the polymer binder may include two-part room temperature/thermal cure epoxy resins. In yet further embodiments, the piezoelectric ceramic crystal 106 may include one or more of $PbNb_2O_6$ (modified lead metaniobates), $Bi_4Ti_3O_{12}$ (used in conjunction with PZT in sol-gel processes), or $LiNbO_3$ single crystals. In addition, the piezoelectric ceramic crystal 106 may include acceptor or donor dopants to adjust (e.g., improve) base performance of the piezoelectric ceramic crystal.

Referring still to FIG. 10, forming the piezoelectric ceramic crystal 106 may include forming the piezoelectric ceramic crystal 106 to include and integrate any of the impedance matching regions 102 and/or backing regions 104 described herein via any of the manners described herein. Furthermore, the impedance matching regions 102 and/or backing regions 104 may be formed and achieved by forming the piezoelectric ceramic crystal 106 to include one or more of the material compositions, structures, and/or gradients described herein.

Some embodiments of the disclosure include methods combining methods 900 and 1000. For instance, methods of the present disclosure may include method 900 followed by method 1000.

Referring to FIGS. 1A-10 together, designing the piezoelectric ceramic crystal 106 and/or regions of the piezoelectric ceramic crystal 106 via iterative modeling and simulations and forming the piezoelectric ceramic crystal 106 to include an integrated impedance matching region 102 and an integrated backing region 104 via additive manufacturing may be advantageous over conventional methods of designing and forming piezoelectric ceramic crystals and may provide piezoelectric ceramic crystals that are advantageous comparative to conventional piezoelectric ceramic crystals. For example, the methods described herein may enable properties of a piezoelectric ceramic crystal (e.g., piezoelectric ceramic crystal 106) to be selected and may produce piezoelectric ceramic crystals having the selected properties. For instance, the methods described herein may enable a piezo-electric constant, an electromechanical coupling factor, and a dielectric constant of the piezoelectric ceramic crystal 106 to be selected. Therefore, the methods described herein provide methods of tuning (e.g., selecting) operating parameters of a piezoelectric ceramic crystal 106 for a given application, such as excitation levels, attenuation of back reflection, bandwidth, and pulse width.

Additionally, the methods described herein may improve impedance matching in comparison to conventional impedance matching layer. For example, as mentioned above, because the impedance matching region 102 of the piezoelectric ceramic crystal 106 is integrated with the piezoelectric ceramic crystal 106 and formed via additive manufacturing processes, the impedance matching region 102 may be formed having more complex structures (e.g., geometrical features) in comparison to conventional matching layers, which may enable the impedance matching region 102 to more closely match an impedance of the target load (e.g., medium to be measured) and more efficiently transmit waves ((e.g., pressure waves) in comparison to conventional matching layers. Additionally, forming the impedance matching region 102 via additive manufacturing processes may enable tailored (e.g., selectable) impedance matching. Furthermore, by integrating the impedance matching region 102 into the piezoelectric ceramic crystal 106, a distinct, abrupt interface between matching layers and the piezoelectric ceramic crystal 106 and any required adhesive or bonding agents are avoided. Removing a distinct, abrupt interface and adhesive or bonding agents improves impedance matching, energy transmission, signal sensitivity, and pulse width of waves during operation of the piezoelectric ceramic crystal 106.

Furthermore, because the backing region 104 of the piezoelectric ceramic crystal 106 is integrated with the piezoelectric ceramic crystal 106 and formed via additive manufacturing processes, the backing region 104 may include more complex structures in comparison to conventional backing layers. For example, in some embodiments, the structure of the backing region 104 may more closely approach natural designs such as coral reef. Having a more complex structure may enable an overall thickness of the backing region 104 to be reduced relative to conventional backing layers. For example, relative to conventional backing layers, the backing region 104 formed via the methods described herein may reduce a thickness of the backing region 104 by at least 20%, at least 30%, or at least 50%. Furthermore, integrating the backing region 104 into the piezoelectric ceramic crystal 106 and forming the backing region 104 via additive manufacturing processes enables engineered (e.g., selectable) back scattering for a given application.

Moreover, the embodiments described herein provide methods for selecting bandwidths over which piezoelectric ceramic crystal 106 operates based on a target load and/or given application. Additionally, the embodiments described herein provide methods for selecting sensitivity and resolutions the piezoelectric ceramic crystal 106b may exhibit. Furthermore, the embodiments described herein provide methods for forming a piezoelectric ceramic crystal 106 exhibiting improved energy transmission relative to conventional piezoelectric ceramic crystals. Also, the embodiments described herein provide methods for forming a piezoelectric ceramic crystal 106 exhibiting selected (e.g., controlled) damping for a target load and/or given application. For example, the embodiments described herein provide methods for designing and forming a piezoelectric ceramic crystal 106b on a case-by-case basis.

Also, the embodiments described herein provide relatively low cost options for application specific (e.g., tunable) piezoelectric ceramic crystals. Furthermore, the embodiments described herein reduce design and manufacturing time relative to conventional methods for forming piezoelectric ceramic crystals. Additionally, the embodiments described herein may optimize material densities, infill packing moduli, chemical compositions, speeds at which sound passes through materials, dielectric constants, piezoelectric constants, and electromechanical coupling factor of acoustic transducers for a given application.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A method of designing a piezoelectric ceramic crystal integrating an impedance matching region and a backing region, the method comprising:
    receiving one or more desired operating parameters of one or more of the piezoelectric ceramic crystal, the impedance matching region of the piezoelectric ceramic crystal, or the backing region of the piezoelectric ceramic crystal for an application;
    iteratively modeling and simulating performance of one or more materials and one or more gradients of the one or more materials to utilize within one or more of the piezoelectric ceramic crystal, the impedance matching region of the piezoelectric ceramic crystal, or the backing region of the piezoelectric ceramic crystal;
    iteratively modeling and simulating performance of one or more structures and one or more gradients of the one or more structures to utilize within one or more of the piezoelectric ceramic crystal, the impedance matching region of the piezoelectric ceramic crystal, or the backing region of the piezoelectric ceramic crystal; and
    identifying at least one material, at least one gradient of the at least one material, at least one structure, and at least one gradient of the at least one structure that exhibits a predicted performance that at least substantially achieves the one or more desired operating parameters of one or more of the piezoelectric ceramic crystal, the impedance matching region of the piezoelectric ceramic crystal, or the backing region of the piezoelectric ceramic crystal for the application.

2. The method of claim 1, further comprising outputting a design of the piezoelectric ceramic crystal integrating the impedance matching region and the backing region based at least partially on the identified at least one material, the identified at least one gradient of the at least one material, the identified at least one structure, and the identified at least one gradient.

3. The method of claim 2, further comprising forming the piezoelectric ceramic crystal integrating the impedance matching region and the backing region via one or more additive manufacturing processes.

4. The method of claim 3, wherein the one or more additive manufacturing processes comprises one or more of binder jetting, stereolithography (SLA), sol-gel or liquid dispense methods, inkjet 3D printing, direct metal deposition, micro-plasma powder deposition, direct laser sintering, selective laser sintering, electron beam melting, or electron beam freeform fabrication.

5. The method of claim 1, wherein iteratively modeling and simulating performance of one or more materials and one or more gradients of the one or more materials comprises iteratively modeling and simulating performance of one or more materials and one or more gradients of the one or more materials to utilize within the impedance matching region of the piezoelectric ceramic crystal to at least substantially match impedance of the impedance matching region with impedance of a target medium of the application.

6. The method of claim 1, wherein iteratively modeling and simulating performance of one or more materials and one or more gradients of the one or more materials comprises iteratively modeling and simulating performance of one or more materials and one or more gradients of the one or more materials to utilize within the backing region of the piezoelectric ceramic crystal to at least substantially achieve a back scattering for the application.

7. The method of claim 1, wherein iteratively modeling and simulating performance of one or more materials and one or more gradients of the one or more materials comprises utilizing one or more machine learning techniques to iteratively model and simulate the performance of the one or more materials and the one or more gradients of the one or more materials.

8. The method of claim 7, wherein the one or more machine learning techniques comprise one or more of quadratic regression analysis, logistic regression analysis, support vector machines, Gaussian process regression, ensemble models, decision tree learning, regression trees, boosted trees, gradient boosted trees, multilayer perceptron, one-vs-rest, Naïve Bayes, k-nearest neighbor, association rule learning, neural networks, deep learning, or pattern recognition.

9. The method of claim 1, wherein receiving one or more required operating parameters comprises receiving requirements regarding one or more of impedance matching, attenuation or dampening levels, piezoelectric properties, signal strength, bandwidth, or footprint.

10. The method of claim 1, wherein iteratively modeling and simulating performance of one or more materials and one or more gradients of the one or more materials comprises utilizing one or more machine learning techniques to iteratively model and simulate the performance of the one or more structures and the one or more gradients of the one or more structures.

11. The method of claim 10, wherein the one or more structures comprise a lattice structure.

12. The method of claim 1, wherein the one or more gradients of the one or more materials and the one or more gradients of the one or more structures are along a longitudinal axis of the piezoelectric ceramic crystal.

13. The method of claim 1, further comprising:
    receiving a three-dimensional model design of the piezoelectric ceramic crystal integrating the impedance matching region and the backing region;
    forming the piezoelectric ceramic crystal via one or more additive manufacturing processes; and forming at least one of the impedance matching region or the backing region of the piezoelectric ceramic crystal to comprise at least one attribute that is graded along an axis of the piezoelectric ceramic crystal.

14. The method of claim 13, wherein the one or more additive manufacturing processes comprise one or more of binder jetting, stereolithography (SLA), sol-gel or liquid dispense methods, inkjet 3D printing, direct metal deposition, micro-plasma powder deposition, direct laser sintering, selective laser sintering, electron beam melting, or electron beam freeform fabrication.

15. The method of claim 13, wherein forming the piezoelectric ceramic crystal integrating the impedance matching region and the backing region via one or more additive manufacturing processes comprises forming the piezoelectric ceramic crystal via a single additive manufacturing process.

16. The method of claim 13, wherein forming at least one of the impedance matching region or the backing region of the piezoelectric ceramic crystal to comprise at least one attribute that is graded along an axis of the piezoelectric ceramic crystal comprises:
    forming the impedance matching region of the piezoelectric ceramic crystal to comprise a first attribute graded according to a first gradient along the axis of the piezoelectric ceramic crystal; and
    forming the backing region of the piezoelectric ceramic crystal to comprise a second attribute graded according to a second gradient along the axis of the piezoelectric ceramic crystal.

17. The method of claim 16, further comprising forming a remainder region of the piezoelectric ceramic crystal to comprise a third attribute graded according to a third gradient along the axis of the piezoelectric ceramic crystal.

18. The method of claim 16, wherein one or more of the first gradient and the second gradient comprise a linear gradient.

19. The method of claim 16, wherein one or more of the first gradient and the second gradient comprise an exponential gradient.

20. The method of claim 1, wherein iteratively modeling and simulating performance of one or more materials and one or more gradients of the one or more materials comprises iteratively modeling and simulating performance of one or more materials and one or more gradients of the one or more materials comprises modeling regions of the impedance matching region of the piezoelectric ceramic crystal or the backing region of the piezoelectric ceramic crystal with different gradients in each of the regions.

* * * * *